(12) United States Patent
Borthakur et al.

(10) Patent No.: US 9,349,767 B2
(45) Date of Patent: May 24, 2016

(54) IMAGE SENSORS WITH THROUGH-OXIDE VIA STRUCTURES

(71) Applicant: Semiconductor Components Industries, LLC, Phoenix, AZ (US)

(72) Inventors: Swarnal Borthakur, Boise, ID (US);
Marc Sulfridge, Boise, ID (US);
Mitchell J. Mooney, Star, ID (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 162 days.

(21) Appl. No.: 14/254,196

(22) Filed: Apr. 16, 2014

(65) Prior Publication Data

US 2015/0303233 A1 Oct. 22, 2015

(51) Int. Cl.
*H01L 27/146* (2006.01)
*H04N 5/369* (2011.01)
*H04N 9/04* (2006.01)

(52) U.S. Cl.
CPC ...... *H01L 27/14636* (2013.01); *H01L 27/1464* (2013.01); *H01L 27/1469* (2013.01); *H01L 27/14634* (2013.01); *H04N 5/369* (2013.01); *H04N 9/045* (2013.01)

(58) Field of Classification Search
CPC .................. H01L 27/14643; H01L 27/14665; H01L 27/14667; H01L 27/14621; H01L 27/1463; H01L 27/14632; H01L 27/14634
See application file for complete search history.

(56) References Cited

U.S. PATENT DOCUMENTS

| 8,497,536 | B2 | 7/2013 | Chen et al. |
| 8,597,074 | B2 | 12/2013 | Farnworth et al. |
| 2011/0233702 | A1* | 9/2011 | Takahashi ......... H01L 21/76898 257/432 |
| 2013/0068929 | A1 | 3/2013 | Solhusvik et al. |
| 2013/0070109 | A1 | 3/2013 | Gove et al. |
| 2013/0221470 | A1 | 8/2013 | Kinsman et al. |
| 2014/0055654 | A1 | 2/2014 | Borthakur et al. |
| 2014/0141560 | A1* | 5/2014 | Maekawa .......... H01L 27/14632 438/64 |

OTHER PUBLICATIONS

Borthakur et al., U.S. Appl. No. 14/191,965, filed Feb. 27, 2014.

* cited by examiner

*Primary Examiner* — Jae Lee
(74) *Attorney, Agent, or Firm* — Treyz Law Group, P.C.; Jason Tsai; Joseph F. Guihan

(57) ABSTRACT

An imaging system may include an image sensor die stacked on top of a digital signal processor (DSP) die. The image sensor die may be a backside illuminated image sensor die. Through-oxide vias (TOVs) may be formed in the image sensor die and may extend at least partially into in the DSP die to facilitate communications between the image sensor die and the DSP die. Color filter housing structures may be formed over active image sensor pixels on the image sensor die. In-pixel grid structures may be integrated with the color filter housing structures to help reduce crosstalk. Light shielding structures may be formed over reference image sensor pixels on the image sensor die. The TOVs, the in-pixel grid structures, and the light shielding structures may be formed simultaneously. The formation of the color filter housing structures may also be integrated the formation of the TOVs.

11 Claims, 6 Drawing Sheets

IMAGE SENSORS WITH THROUGH-OXIDE VIA STRUCTURES

BACKGROUND

This relates generally to imaging systems, and more particularly, to imaging systems with through-oxide vias (TOVs).

Modern electronic devices such as cellular telephones, cameras, and computers often use digital image sensors. Imaging systems (i.e., image sensors) often include a two-dimensional array of image sensing pixels. Each pixel typically includes a photosensitive element such as a photodiode that receives incident photons (light) and converts the photons into electrical signals. The imaging system contains an image sensor die with an image sensor integrated circuit and an array of photodiodes. The image sensor die is mounted on a digital signal processor (DSP) die.

Circuitry within the image sensor die may be coupled to circuitry within the digital signal processor die using through-oxide vias (i.e., metal via structures formed through at least a first oxide layer in the image sensor die and at least a second oxide layer in the DSP die). The amount of time, space, efficiency, and cost for forming via connections in the integrated circuits may, however, be limited. In conventional imaging systems, the steps for forming through-oxide via structures connecting the circuitry in the image sensor die to the circuitry in the DSP die are inefficient and costly.

It would therefore be desirable to provide improved ways of forming via connections in imaging systems.

DETAILED DESCRIPTION

Electronic devices such as digital cameras, computers, cellular telephones, and other electronic devices include image sensors that gather incoming image light to capture an image. The image sensors may include arrays of imaging pixels. The pixels in the image sensors may include photosensitive elements such as photodiodes that convert the incoming image light into image signals. Image sensors may have any number of pixels (e.g., hundreds or thousands or more). A typical image sensor may, for example, have hundreds of thousands or millions of pixels (e.g., megapixels). Image sensors may include control circuitry such as circuitry for operating the imaging pixels and readout circuitry for reading out image signals corresponding to the electric charge generated by the photosensitive elements.

Figure 1:
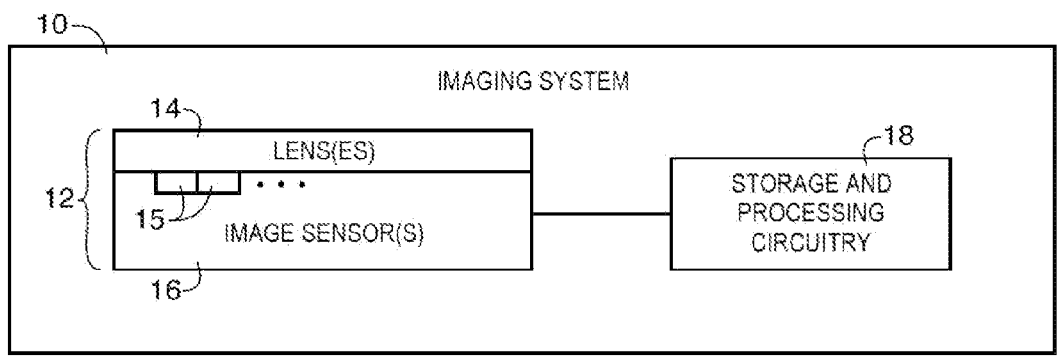
FIG. 1 is a diagram of an illustrative imaging system that may include a camera module having an image sensor in accordance with an embodiment of the present invention.

FIG. 1 is a diagram of an illustrative electronic device that uses an image sensor to capture images. Electronic device 10 of FIG. 1 may be a portable electronic device such as a camera, a cellular telephone, a video camera, or other imaging device that captures digital image data. Camera module 12 may be used to convert incoming light into digital image data. Camera module 12 may include one or more lenses 14 and one or more corresponding image sensors 16. During image capture operations, light from a scene may be focused onto image sensor 16 using lens 14. Image sensor 16 may provide corresponding digital image data to processing circuitry 18. Image sensor 16 may, for example, be a backside illumination (BSI) image sensor. If desired, camera module 12 may be provided with an array of lenses 14 and an array of corresponding image sensors 16. Image sensor 16 may include an array of image sensor pixels such as an array of image sensor pixels 15 and a corresponding array of color filter elements.

Processing circuitry 18 may include one or more integrated circuits (e.g., image processing circuits, microprocessors, storage devices such as random-access memory and non-volatile memory, etc.) and may be implemented using components that are separate from camera module 12 and/or that form part of camera module 12 (e.g., circuits that form part of an integrated circuit that includes image sensors 16 or an integrated circuit within module 12 that is associated with image sensors 16). Image data that has been captured by camera module 12 may be processed and stored using processing circuitry 18. Processed image data may, if desired, be provided to external equipment (e.g., a computer or other device) using wired and/or wireless communications paths coupled to processing circuitry 18.

Figure 2:
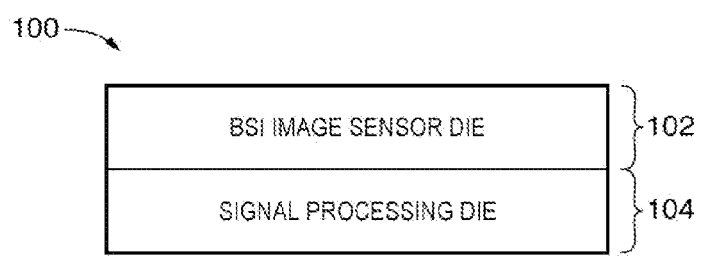
FIG. 2 is a diagram of an illustrative imaging system that includes a backside illuminated (BSI) image sensor die stacked on top of a signal processing die in accordance with an embodiment of the present invention.

FIG. 2 shows an imaging system 100 that includes an image sensor die 102 stacked on top of a signal processing die 104. Image sensor die 102 may be a backside illuminated (BSI) image sensor (as an example). Configured in this way, image sensor die 102 may include an array of image sensor pixels operable to produce image data (i.e., still or video data). Image data produced by image sensor die 102 may then be fed to signal processing die for further processing. Die 104 may sometimes be referred to as a digital signal processor (DSP). The example of FIG. 2 is merely illustrative. If desired, image sensor die 102 may be a front-side illuminated (FSI) image sensor die.

In conventional imaging systems, circuitry within a DSP die may communicate with circuitry within an image sensor die that is stacked on top of the DSP die using through-oxide vias. Through-oxide vias are formed in a first processing step. Light shielding structures are then formed over the through-oxide vias in a second processing step after the first processing step. Color filter housing structures are then formed over corresponding image sensor pixels in the image sensor in a third processing step after the second processing step. Forming image sensor structures in this way requires many processing steps and can be inefficient and costly.

Figure 3:
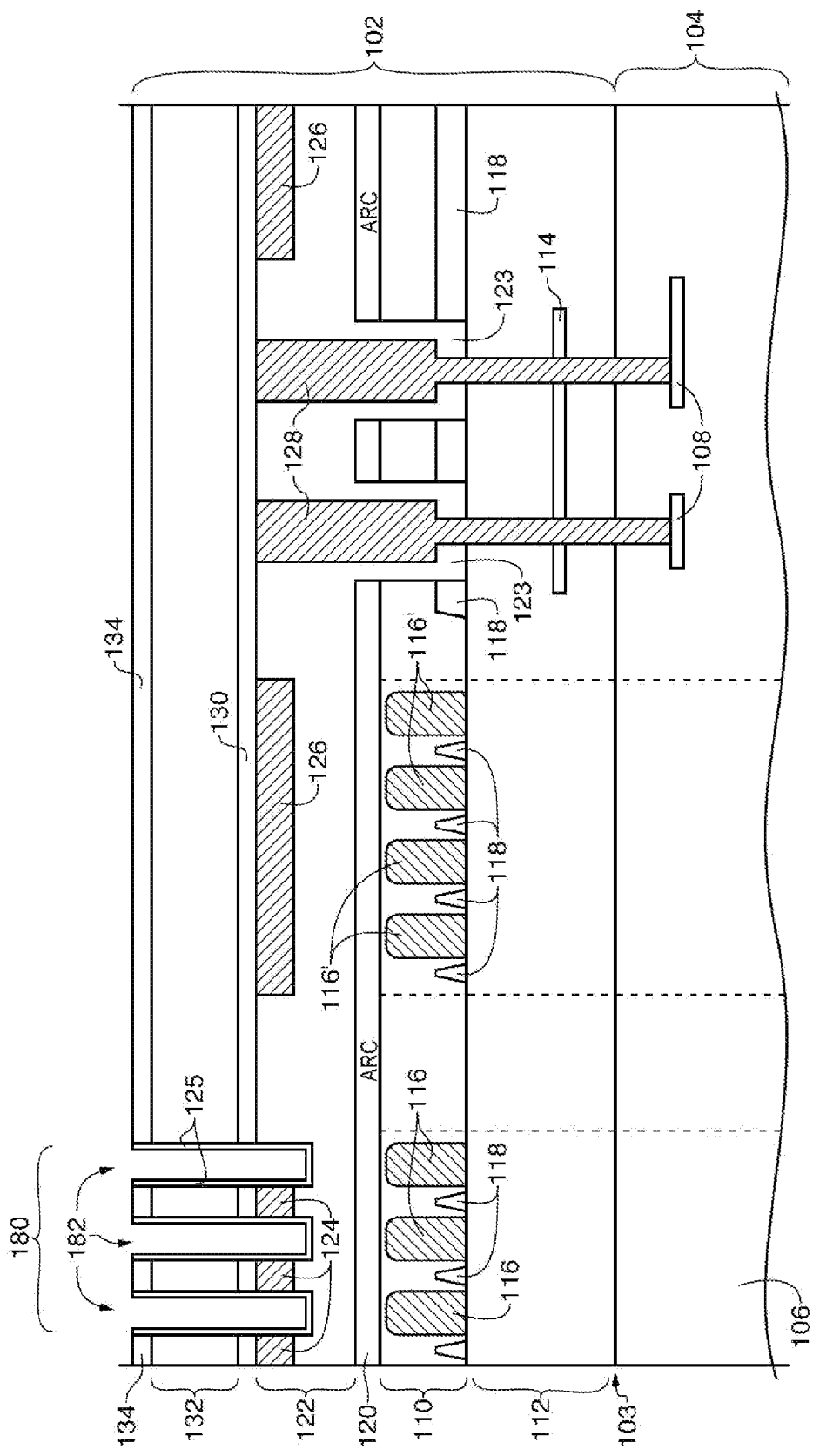
FIG. 3 is a cross-sectional side view of an illustrative imaging system having color filter housing structures and having through-oxide vias, light shields, and an in-pixel grid that are formed in the same step in accordance with an embodiment of the present invention.

In accordance with an embodiment of the present invention, an image sensor die is provided that can be formed using a reduced number of steps. FIG. 3 is a cross-sectional side view of image sensor die 102 that is stacked on top of signal processing die 104. The interface at which dies 102 and 104 are stacked is marked by arrow 103.

As shown in FIG. 3, image sensor die 102 may include a substrate 110 having a front surface and a back surface and interconnect routing layers 112 formed on the front surface of substrate 110. Layers 112 may include alternating metal routing layers and via layers (e.g., routing structures formed in dielectric material) and may sometimes be referred to collectively as a dielectric stack.

Photosensitive elements such as photodiodes 116 may be formed at the front surface of substrate 110. Photodiodes 116 that are formed in an "active" portion of image sensor die 102 may receive incoming light and convert the incoming light into corresponding pixel signals, whereas photodiodes 116' that are formed in a peripheral portion of image sensor 102 may not receive any incoming light and may serve as reference photodiodes for noise canceling purposes (as an example). Shallow trench isolation (STI) structures such as STI structures 118 may be formed in the front surface of substrate 110 between each adjacent pair of photodiodes. STI structures 118 may serve to ensure that neighboring photodiodes are electrically isolated from one another.

An antireflective coating (ARC) layer such as ARC layer 120 may be formed at the back surface of substrate 110. Layer may be formed from hafnium oxide (as an example). ARC layer 120 may serve to ensure that light entering substrate 110 from the back side is not reflected back towards the direction from which it arrived.

A first dielectric layer 122 (e.g., a first oxide layer) may be formed over layer 120. A first passivation layer 130 may be formed on the first dielectric layer 122. A second dielectric layer (e.g., a second oxide layer) may be formed on the first passivation layer 130. A second passivation layer 134 may be formed on the second dielectric layer 130. Passivation layers 130 and 134 may be formed from nitride material (as an example).

Still referring to FIG. 3, color filter housing structures 180 may be formed in the active portion of image sensor die 102. Color filter housing structures 180 may include an array of slots 182 in which color filter elements may be inserted. An array of color filter elements that are contained within such types of housing structures are sometimes referred to as a CFA-in-a-box (abbreviated as "CIAB"). Color filter array housing structures 180 may have walls that are formed from the dielectric material in layer 132 and may serve to provide improved light guiding capabilities for directing light to desired image sensor pixels.

In some embodiments, an opaque grid structure such as grid 124 may be formed over the image sensor pixels in the active portion. Grid 124 may be formed from metal or other opaque materials and may also help direct light to the desired image sensor pixels. Grid structure 124 may be a grid-shaped series of intersecting opaque lines that define a rectangular array of pixel openings. Each of the openings in the grid is aligned with a respective color filter element in a corresponding array of color filter elements. Grid structure 124 formed in this way may sometimes be referred to as an in-pixel grid or an in-pixel matrix. In such embodiments, an additional dielectric sidewall coating such as oxide liner 125 may be deposited within slots 182 so that the sidewall coating covers the side of the metal in-pixel grid. Liner 125 formed in this way may serve to reduce the amount of reflection from grid structures 124.

As shown in FIG. 3, inter-die via structures such as via structures 128 may traverse through at least a portion of die 102 and die 104. Via structures 128 may serve to connect circuitry within die 102 to circuitry within die 104. For example, vias 128 may connect metal routing structures 114 in dielectric stack 112 of die 102 to corresponding metal routing structures 108 in a dielectric stack 106 within die 104. Vias 128 may be formed through the oxide material in layers 122, 112, and 106 and may therefore sometimes be referred to herein as through-oxide vias (TOVs). Vias 128 may also be formed through STI structures 118 at the front surface of substrate 110.

In the example of FIG. 3, TOVs 128 may be constructed during formation of dielectric layer 122. For example, after ARC layer 120 has been formed on the back surface of substrate 110, a first hole can be formed through layer 120 and substrate 110 (e.g., through shallow trench isolation structures 118 formed at the back surface of substrate 110). Thereafter, oxide material 122 may be deposited on top of layer 120 and may coat the sidewall and bottom of the first hole (see, oxide material 123 in FIG. 3). Once the oxide material for layer 122 has been formed, a second hole that is smaller than the first hole can be formed through the center of the first hole through layer 122, substrate 110, layers 112, and through at least a portion of the interconnect routing layers 106 in die 104.

Conductive material (e.g., copper, aluminum, tungsten, silver, gold, a combination of these materials, or other suitable conducting material) can then be deposited into the remaining hole to form a TOV structure. In FIG. 3, sidewall liner 123 and layer 122 may represent the same dielectric layer.

In one suitable arrangement, light shielding structures such as light shielding structures 126 and in-pixel grid structures 124 may be formed at the same time as TOV structure 128 (e.g., structures 124, 126, and 128 may be formed simultaneously). In such arrangements, structures 124, 126 and 128 may be formed in at least the same dielectric layer (e.g., in oxide layer 122). As described above, in-pixel grid 124 may serve to help direct incoming light and reduce pixel crosstalk. Vias 128 may facilitate communication between die 102 and die 104. Light shield 126 may prevent light from reaching the reference photodiodes 116' or yet other structures in the peripheral/inactive portion of image sensor die 102.

Since in-pixel grid structures 124, light shielding structures 126, and TOV structures 128 are formed simultaneously, structures 124, 126, and 128 may be formed from the same conductive and opaque material. Forming these structures in the same processing step can help reduce the total number of manufacturing steps and reduce cost.

Figure 4:
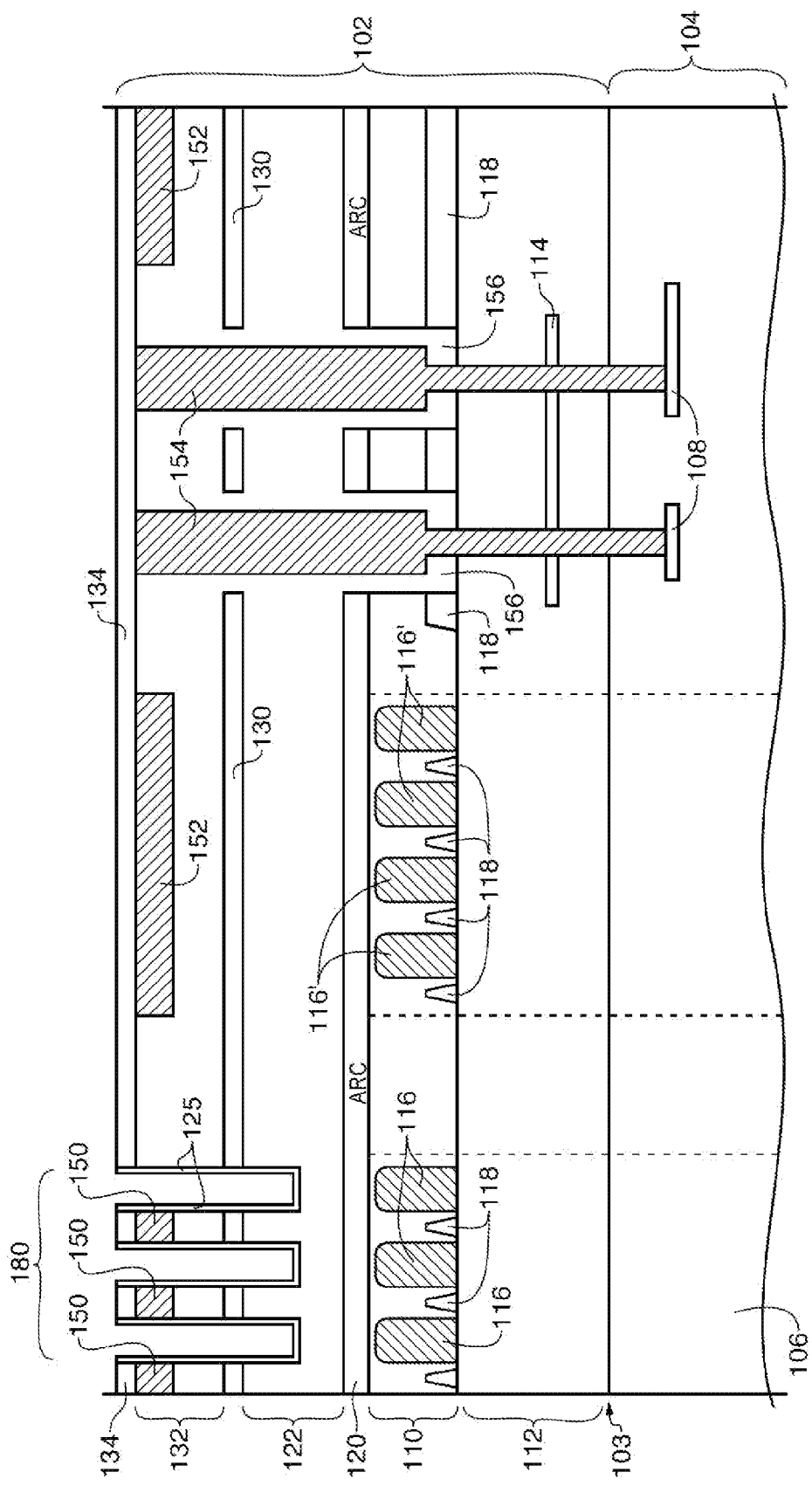
FIG. 4 is a cross-sectional side view of an illustrative imaging system having through-oxide vias and color filter housing structures formed during the same steps in accordance with an embodiment of the present invention.

In another suitable arrangement, the TOV structures 154 may be formed at the same time as the color filter housing structures 180 (see, e.g., FIG. 4). As shown in FIG. 4, through-oxide vias 154 may be formed through the second oxide layer 132, first passivation layer 130, first oxide layer 122, image sensor substrate 110 (e.g., through STI structures 118 formed at the front surface of substrate 110), routing layers 112 in die 102, and at least a portion of the routing layers 106 in die 104.

For example, after passivation layer 130 has been formed on dielectric layer 122, a first hole can be formed through layers 130, 122, 120, and substrate 110. Thereafter, oxide material 132 may be deposited on top of layer 130 and may coat the sidewall and bottom of the first hole (see, oxide liner 156 of TOV 154 in FIG. 4). Once the oxide material for layer 132 has been formed, a second hole that is smaller than the first hole can be formed through the center of the first hole through layer 132, layer 130, layer 122, substrate 110, layers 112, and through at least a portion of the interconnect routing layers 106 in die 104.

Conductive material (e.g., copper, aluminum, tungsten, silver, gold, a combination of these materials, or other suitable conducting material) can then be deposited into the remaining hole to form TOV structure 154. In FIG. 4, sidewall liner 156 and layer 132 may represent the same dielectric layer.

In this arrangement, light shielding structures 152 and in-pixel grid structures 150 may be formed at the same time as TOV structure 154 (e.g., structures 150, 152, and 154 may be formed simultaneously). In such arrangements, structures 150, 152 and 154 may be formed in at least the same dielectric layer (e.g., in second oxide layer 132). In-pixel matrix 150 may serve to help direct incoming light and reduce pixel crosstalk. In such embodiments, an additional dielectric sidewall coating such as oxide liner 125 may be deposited within the CIAB slots so that the sidewall coating covers the side of metal in-pixel grid 150. Liner 125 formed in this way may serve to reduce the amount of reflection from grid structures 150. Vias 154 may facilitate communication between die 102 and die 104. Light shield 152 may prevent light from reaching the reference photodiodes 116' or yet other structures in the peripheral/inactive portion of image sensor die 102.

Structures 150, 152, and 154 may be formed from the same conductive and opaque material. In the example of FIG. 4, the walls of color filter array housing structure 180 are formed from the oxide material in layer 132. The CIAB oxide walls may therefore be formed at the same as the oxide material 156 lining TOVs 154. Formed in this way, the CFA housing structures (or CIAB structures) are sometimes referred to as being integrated with the through-oxide vias 154. Forming structures 150, 152, and 154 in the same processing step and integrating the color filter housing structures with the TOV structures can help simplify process flow with fewer steps and fewer masks, can potentially help reduce stack height (i.e., the thickness of die 102) for better optical performance, and can also help provide a more uniform thickness across die 102 (i.e., to help ensure that the stack height in the active pixel imaging region is substantially similar to the stack height in the peripheral inactive region).

Figure 5:
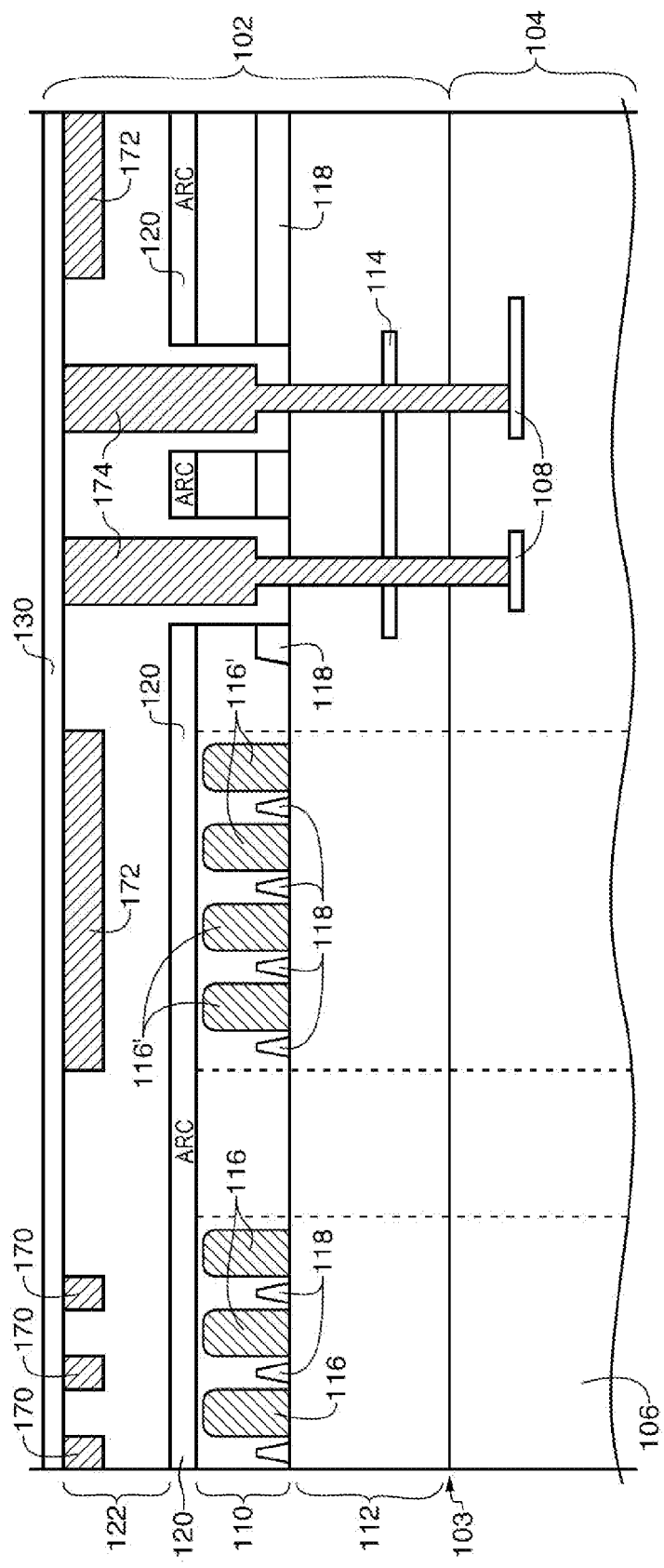
FIG. 5 is a cross-sectional side of an illustrative imaging system having no color filter housing structures and having through-oxide vias, light shields, and an in-pixel grid that are formed in the same step in accordance with an embodiment of the present invention.

FIG. 5 shows yet another suitable embodiment. The arrangement of FIG. 5 is similar to the configuration of FIG. 3, except the arrangement in FIG. 5 does not include color filter array housing structures. As shown in FIG. 5, image sensor die 102 may include in-pixel grid structures 170 formed over corresponding active image sensor pixels, light shielding structures 172, and TOVs 174 formed in at least dielectric layer 122. Structures 170, 172, and 174 may be formed simultaneously (e.g., by depositing copper into corresponding cavities patterned in the surface of layer 122). Even though CIAB structures are not directly integrated on die 102, a separate color filter array structure (not shown) may be formed over die 102 to filter incoming light.

Figure 6:
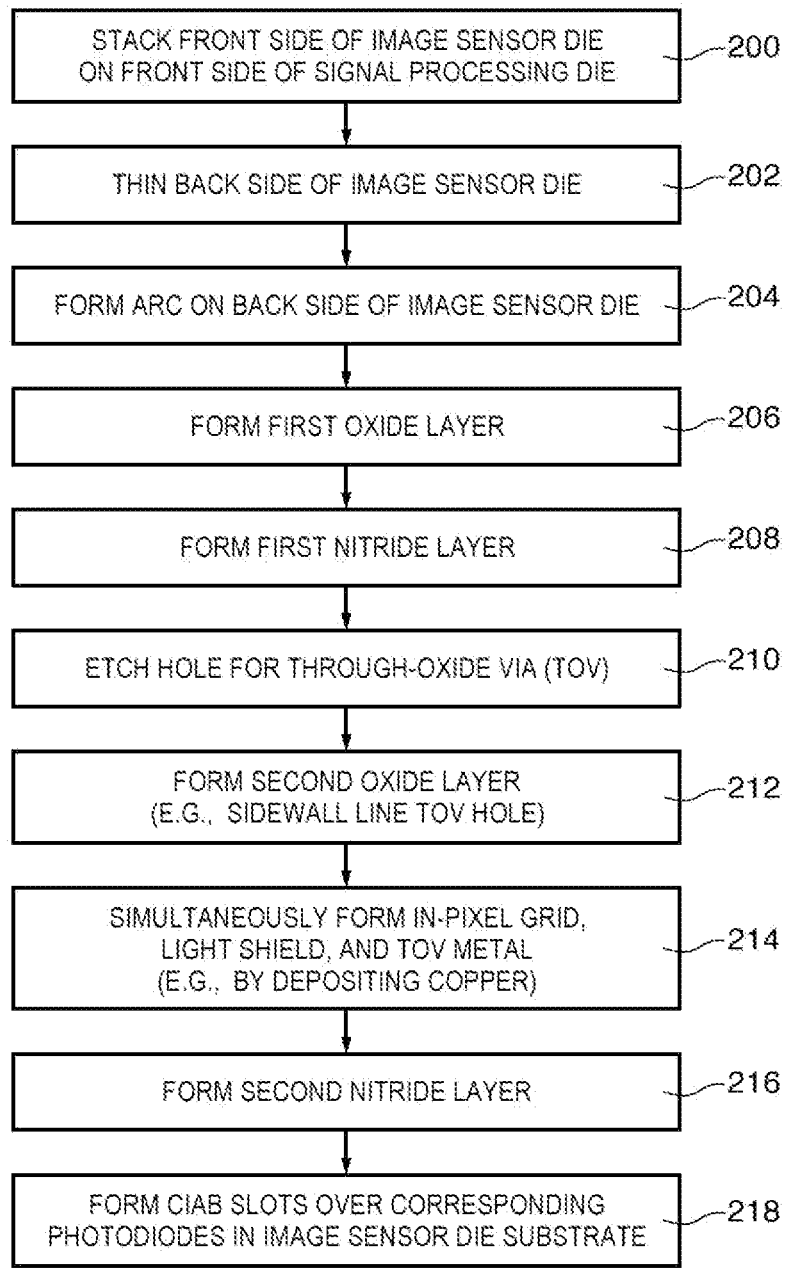
FIG. 6 is a flow chart of illustrative steps involved in forming an imaging system with through-oxide via structures in accordance with an embodiment of the present invention.

FIG. 6 is a flow chart of illustrative steps for manufacturing an imaging system of the type described in connection with FIG. 4. At step 200, the front side of image sensor die 102 may be stacked directly on the front side of signal processing die 104. The front side of each die may generally refer to the side at which interconnect routing layers are formed.

At step 202, the back side of substrate 110 of image sensor 102 may be thinned down to help reduce stack height. Prior to this step, photodiodes 116, shallow trench isolation structures 118, other pixel control circuitry, and associated routing circuitry in stack 112 may have already been formed.

At step 204, ARC liner 120 may be formed on the back side of substrate 110. At step 206, a first oxide layer 122 may be formed on the ARC liner 120. At step 208, a first passivation layer 130 (e.g., a first nitride liner) may be formed on the first oxide layer.

At step 210, a first hole may be etched through layers 130, 122, 120, and substrate 110. At step 212, oxide material may be deposited on top of layer 130 to form second oxide layer 132 and to also coat the sidewall and bottom of the first hole. At step 214, additional holes may be patterned in layer 132 to form recesses for TOV structures, in-pixel grid structures, and light shielding structures. For example, at least an additional second hole may be formed through the center of the first hole and may extend into DSP die 104 while cavities for the in-pixel grid structures and the light shielding structures may be etched out. During step 214, these holes and cavities may be simultaneously filled with opaque, conductive material (e.g., copper) to form structures 150, 152, and 154 (see, e.g., FIG. 4).

At step 214, a second passivation layer (e.g., a second nitride liner) may be formed on the second oxide layer 132. At step 218, CFA housing structures 180 may be formed over corresponding photodiodes in the active imaging region of die 102 (e.g., by forming slots through at least layers 134 and 132, where the slots are configured to receive color filter elements).

Figure 7:
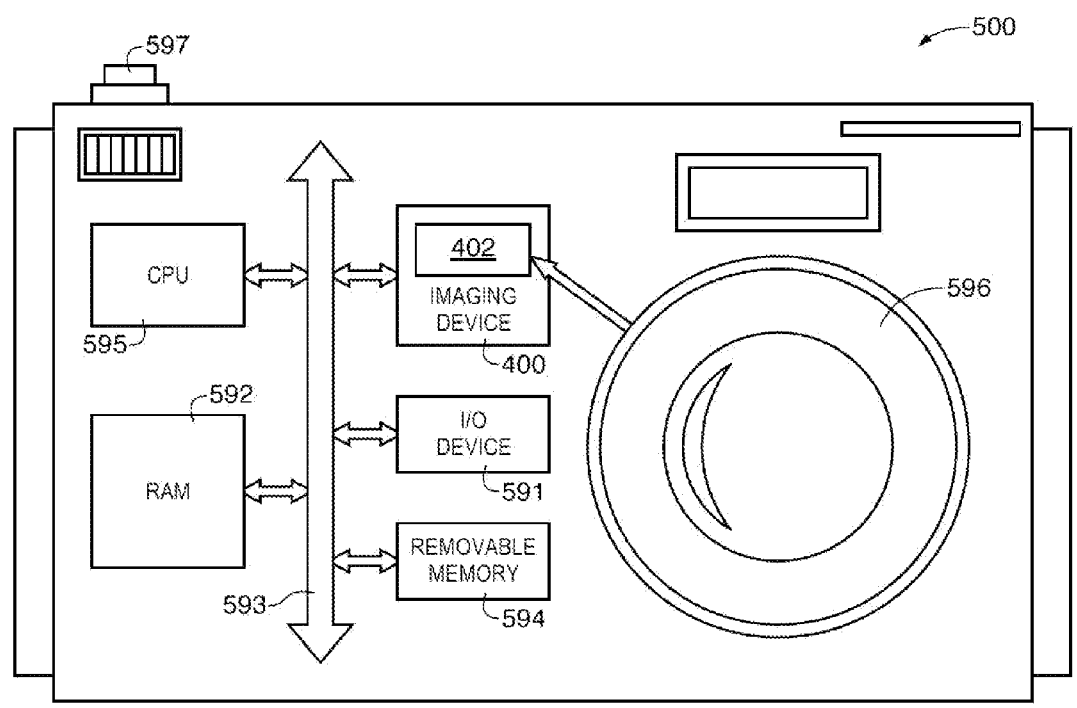
FIG. 7 is a block diagram of a system employing at least some of the embodiments of FIGS. 1-6 in accordance with an embodiment of the present invention.

FIG. 7 shows in simplified form a typical processor system 500, such as a digital camera, which includes an imaging device 400. Imaging device 400 may include a pixel array 402 having pixels of the type shown in FIG. 1 (e.g., pixel array 402 may be an array of image pixels formed on an image sensor SOC). Processor system 500 is exemplary of a system having digital circuits that may include imaging device 400. Without being limiting, such a system may include a computer system, still or video camera system, scanner, machine vision, vehicle navigation, video phone, surveillance system, auto focus system, star tracker system, motion detection system, image stabilization system, and other systems employing an imaging device.

Processor system 500, which may be a digital still or video camera system, may include a lens such as lens 596 for focusing an image onto a pixel array such as pixel array 30 when shutter release button 597 is pressed. Processor system 500 may include a central processing unit such as central processing unit (CPU) 595. CPU 595 may be a microprocessor that controls camera functions and one or more image flow functions and communicates with one or more input/output (I/O) devices 591 over a bus such as bus 593. Imaging device 400 may also communicate with CPU 595 over bus 593. System 500 may include random access memory (RAM) 592 and removable memory 594. Removable memory 594 may include flash memory that communicates with CPU 595 over bus 593. Imaging device 400 may be combined with CPU 595, with or without memory storage, on a single integrated circuit or on a different chip. Although bus 593 is illustrated as a single bus, it may be one or more buses or bridges or other communication paths used to interconnect the system components.

Various embodiments have been described illustrating an electronic device (see, e.g., device 10 of FIG. 1) that includes an imaging system and host subsystems. An imaging system may include one or more image sensors. Each image sensor may include an array of image pixels formed on a semiconductor substrate. Each image pixel may include one or more photosensitive elements configured to convert incoming light into electric charges.

In particular, imaging circuitry may include an image sensor die stacked on top of a digital signal processor (DSP) die. The image sensor die may include a substrate having front and back surfaces, a plurality of imaging pixels and shallow trench isolation (STI) structures formed in the front surface of the substrate, interconnect routing layers formed on the front surface of the substrate, a layer of antireflective coating (ARC) material formed on the back surface of the substrate, a first dielectric layer formed on the ARC layer, a first passivation layer formed on the first dielectric layer, a second dielectric layer formed on the first passivation layer, and a second passivation layer formed on the second dielectric layer. The first and second dielectric layers may be formed from oxide, whereas the first and second passivation layers may be formed from nitride (as examples).

In one suitable arrangement, a through-oxide via (TOV) structure may be formed through the first dielectric layer, the second dielectric layer, the substrate, and the interconnect routing layers, and may extend partly into the DSP die. A TOV formed in this way may serve to convey image pixel signals from the image sensor die to the DSP die. The image sensor die may also include light shielding structures and/or in-pixel grid structures that are formed in the second dielectric layer. The TOV structure, the light shielding structure, and/or the in-pixel grid structures may be formed simultaneously using the same opaque, conductive material. In some embodiments, the image sensor die may also include color filter array housing structures (sometimes referred to as CFA-in-a-box structures) having walls that are constructed during formation of the TOV structure (e.g., the color filter array housing structures may be integrated with the TOV structure).

The foregoing is merely illustrative of the principles of this invention and various modifications can be made by those skilled in the art. The foregoing embodiments may be implemented individually or in any combination.

Although the invention has been described in some detail for the purposes of clarity, it will be apparent that certain changes and modifications can be practiced within the scope of the appended claims. Although some of the appended claims are single dependent only or reference only some of their preceding claims, their respective feature(s) can be combined with the feature(s) of any other claim.

What is claimed is:

1. Imaging circuitry, comprising:
   a digital signal processor die; and
   an image sensor die mounted on the digital signal processor die, wherein the image sensor die comprises:
   a through-oxide via structure that extends at least partly into the digital signal processor die;
   a light shielding structure, wherein the light shielding structure and the through-oxide via structure are formed in at least a common dielectric layer in the image sensor die; and
   color filter array housing structures that are formed in the same dielectric layer in which the light shielding structure is formed, wherein the through-oxide via structure has a dielectric liner, and wherein the color filter array housing structures have walls that are formed at the same time as the dielectric liner.

2. The imaging circuitry defined in claim 1, wherein the through-oxide via structure conveys image pixel signals from the image sensor die to the digital signal processor die.

3. The imaging circuitry defined in claim 1, wherein the image sensor die further comprises:
   a substrate;
   a shallow trench isolation structure formed in the substrate, wherein the through-oxide via structure is formed through the shallow trench isolation structure.

4. The imagine circuitry defined in claim 1, wherein the image sensor die comprises a backside illuminated (BSI) image sensor die.

5. The imaging circuitry defined in claim 1, wherein the image sensor die further comprises:

a substrate;
a plurality of image sensor pixels formed in the substrate; and
an in-pixel grid structure that includes openings corresponding to respective image sensor pixels in the plurality of image sensor pixels and that is formed in the same dielectric layer in which the light shielding structure is formed.

6. The imaging circuitry defined in claim 5, wherein the in-pixel grid structure, the light shielding structure, and the through-oxide via structure are formed simultaneously.

7. The imaging circuitry defined in claim 1, wherein the image sensor die further comprises:
   a plurality of imaging pixels formed directly below the color filter array housing structures; and
   a plurality of reference pixels formed directly below the light shielding structure, wherein the light shielding structure prevents the plurality of reference pixels from receiving incoming light.

8. A system, comprising:
   a signal processing unit;
   memory;
   a lens;
   input-output circuitry; and
   an imaging device that is stacked on the signal processing unit, wherein the imaging device comprises:
   a substrate having a front surface and a back surface;
   a plurality of imaging pixels formed in the front surface of the substrate;
   a dielectric layer formed over the back surface of the substrate;
   a light shield formed in the dielectric layer;
   a through-oxide via (TOV) formed through the dielectric layer, wherein the through-oxide via extends at least partly into the signal processing unit; and
   an opaque matrix having openings corresponding to respective imaging pixels in the plurality of imaging pixels, wherein the opaque matrix is also formed in the dielectric layer.

9. The system defined in claim 8, wherein the light shield and the through-oxide via are formed simultaneously.

10. A system, comprising:
    a signal processing unit;
    memory;
    a lens;
    input-output circuitry; and
    an imaging device that is stacked on the signal processing unit, wherein the imaging device comprises:
    a substrate having a front surface and a back surface;
    a plurality of imaging pixels formed in the front surface of the substrate;
    a dielectric layer formed over the back surface of the substrate;
    a light shield formed in the dielectric layer;
    a through-oxide via (TOV) formed through the dielectric layer, wherein the through-oxide via extends at least partly into the signal processing unit; and
    color filter array housing structures having walls that are constructed during the formation of the through-oxide via.

11. The system defined in claim 8, wherein the imaging device further comprises:
    an anti-reflective liner formed on the back surface of the substrate; and a passivation layer that is interposed between the anti-reflective liner and the dielectric layer.

\* \* \* \* \*